United States Patent [19]

Parle

[11] Patent Number: 5,028,874
[45] Date of Patent: Jul. 2, 1991

[54] RATIOMETRIC MEASUREMENT CIRCUIT WITH IMPROVED NOISE REJECTION

[75] Inventor: Jonathan J. Parle, Seattle, Wash.

[73] Assignee: John Fluke Mfg. Co., Inc., Everett, Wash.

[21] Appl. No.: 430,308

[22] Filed: Nov. 1, 1989

[51] Int. Cl.$^5$ .......................................... G01R 25/06
[52] U.S. Cl. .................................... 324/608; 324/607
[58] Field of Search ............. 324/605, 607, 608, 612, 324/615, 619, 613, 614

[56] References Cited

U.S. PATENT DOCUMENTS

| | | | |
|---|---|---|---|
| 3,895,376 | 7/1975 | Uchida | 324/607 X |
| 4,187,459 | 2/1980 | Wolfendale | 324/607 X |
| 4,263,653 | 4/1981 | Mecklenburg | 324/607 X |
| 4,608,553 | 8/1986 | Ormond | 324/99 D X |
| 4,748,399 | 5/1988 | Caldwell et al. | 324/613 |
| 4,816,745 | 3/1989 | Schneider | 324/607 X |

Primary Examiner—Kenneth A. Wieder
Assistant Examiner—Robert W. Mueller
Attorney, Agent, or Firm—Richard A. Koske

[57] ABSTRACT

A noise rejection circuit improves the signal-to-noise ratio of a ratiometric measurement circuit. A first operational amplifier produces a scaled-up voltage proportional to a low reference voltage. The scaled-up voltage is applied to a series connected reference resistance, whose value is known, and a resistance whose value is unknown and is to be measured. A parameter voltage formed across the resistance is applied to second operational amplifier acting as a buffer. A buffered parameter voltage is scaled down by a voltage divider. The scaled-down voltage is applied to a ratiometric converter, that produces an output representative of the unknown resistance value. The ratio of a first pair of resistors that determines the gain of the first operational amplifier is the same as the ratio of a second pair of resistors that form the voltage divider, such that the low reference voltage is scaled up and the parameter voltage is scaled down by the same factor. The ratiometric converter operates from a low power supply voltage and consumes low amounts of power. The first and second amplifiers are CMOS operational amplifiers that, despite operating from a relatively high power supply voltage, consume low amounts of power.

22 Claims, 1 Drawing Sheet

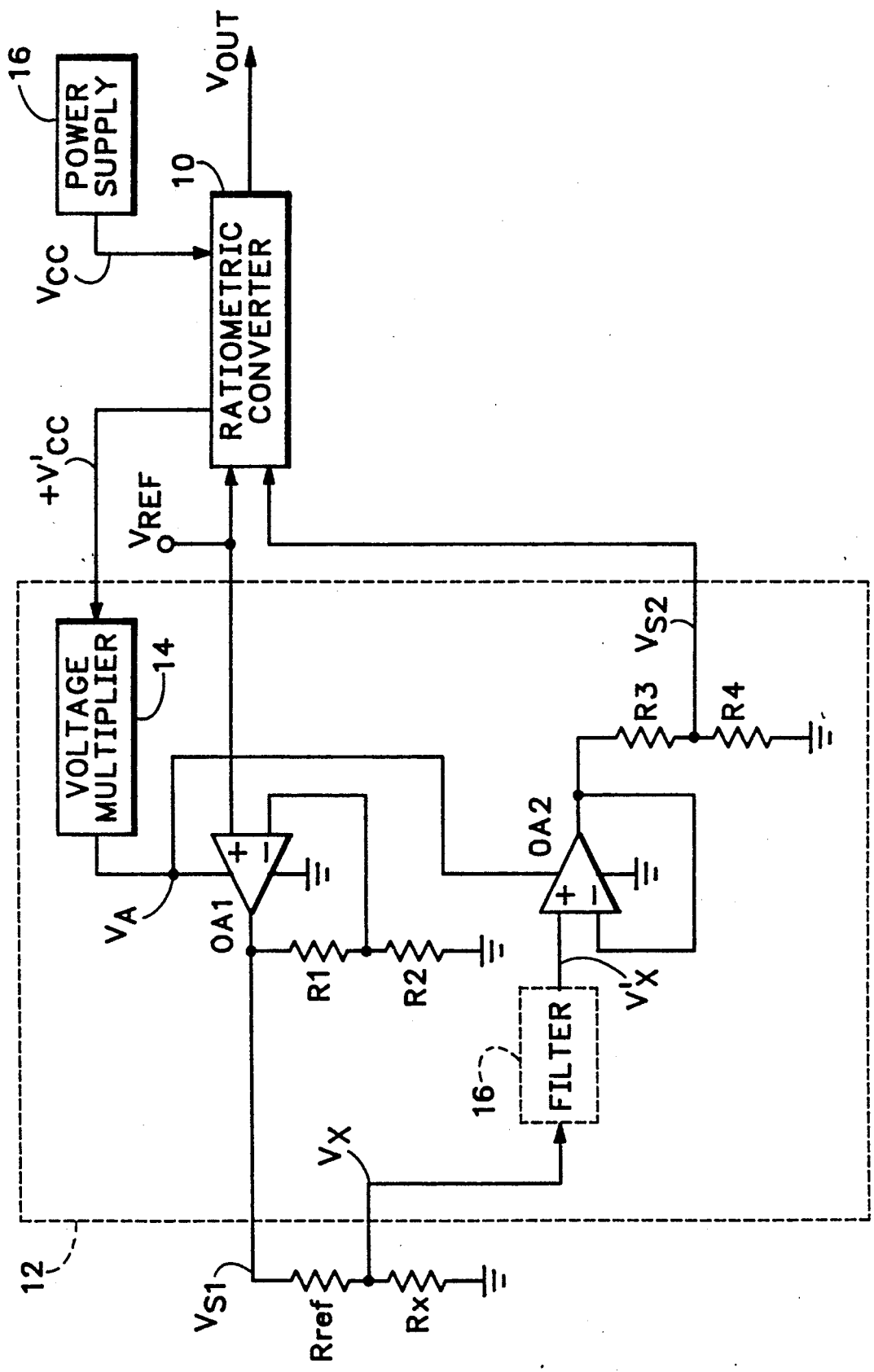

RATIOMETRIC MEASUREMENT CIRCUIT WITH IMPROVED NOISE REJECTION

FIELD OF THE INVENTION

This invention relates to measurement circuits and, particularly, to ratiometric measurement circuits employing dual slope analog-to-digital converters.

BACKGROUND OF THE INVENTION

The measurement of electric circuit parameters, such as resistance and conductance using ratiometric techniques, is well known. Many ratiometric measurement circuits use a dual slope analog-to-digital(A/D) converter to measure the unknown value of a parameter. These A/D converters are commonly referred to as ratiometric converters when used in ratiometric measurement circuits. Ratiometric converters consume relatively small amounts of power and, hence, have found widespread use in battery powered devices, such as portable measurement instruments.

Many times the circuit parameters to be measured are located in "noisy" environments, such as telephone lines, for example, in which the noise exists as leakage current and/or a.c. interference. As is well known, noise may reduce the accuracy of measurement instruments. In fact, the accuracy of a ratiometric measurement instrument depends, at least in part, on the noise rejection capability of the ratiometric measurement circuit. That is, to some degree, the better the signal-to-noise ratio of the ratiometric measurement circuit, the higher the accuracy of the measurement instrument.

One way that prior art ratiometric measurement circuits achieve improved noise rejection is by operating with relatively high voltages, such as power supply voltages of ±15 volts and a reference voltage of 10 volts, for example, as opposed to lower power supply and references voltages, such as ±3 volts and 1 volt, respectively. The use of a higher reference voltage results in an increased signal-to-noise ratio and, hence, improved noise rejection by the prior art measurement circuits. However, the higher reference voltage requires using ratiometric converters with greater dynamic range. Unfortunately, the increased dynamic range translates into increased power consumption by the ratiometric converter, which is highly undesirable for battery powered circuits, such as those found in portable measurement instruments.

Accordingly, there is a need for a ratiometric measurement circuit that has improved noise rejection and achieves this improved noise rejection without consuming a significant amount of additional power. Further, the improved noise rejection should require a minimal number of additional components so that the entire measurement circuit may be easily packaged in a portable instrument. The present invention is directed to a ratiometric measurement circuit designed to achieve these results.

SUMMARY OF THE INVENTION

In accordance with this invention, a ratiometric measurement circuit with improved noise rejection is provided. A dual slope analog-to-digital (i.e., ratiometric) converter operates from a low power supply voltage and a low reference voltage and is responsive to a first voltage related to a first parameter whose value is unknown such that the ratiometric converter produces an output representative of the unknown value of the first parameter. A noise rejection circuit is coupled to the ratiometric converter and the first parameter. The noise rejection circuit operates from a high power supply voltage related to the low power supply voltage. The noise rejection circuit produces a scaled-up voltage having a magnitude greater than and proportional to the low reference voltage and applies the scaled-up voltage to the first parameter so as to form a parameter voltage at the first parameter. The parameter voltage is scaled down to form the first voltage.

In accordance with further aspects of the present invention, the noise rejection circuit includes a first amplifier that produces the scaled-up voltage and a second amplifier that buffers the parameter voltage. A buffered parameter voltage is applied to a voltage divider that produces the first voltage. The gain of the first amplifier and the input-to-output ratio of the voltage divider are inversely proportional. The first voltage is applied to the ratiometric converter. The ratiometric converter integrates the first voltage in one direction for a predetermined period of time and subsequently integrates the difference between the low reference voltage and the first voltage in a direction opposite to the integration of the first voltage so as to change (i.e., de-integrate) the previously integrated value. The time it takes to change the previously integrated value to a pre-determined value (i.e., the de-integration time) is proportional to the unknown value of the first parameter.

In accordance with further aspects of the present invention, the first and second amplifiers are operational amplifiers. The gain of the first operational amplifier is determined by a first pair of resistors and the voltage divider is formed by a second pair of resistors. The ratio of the first pair of resistors is substantially the same as the ratio of the second pair of resistors.

In accordance with still further aspects of the present invention, a voltage multiplier multiplies the low power supply voltage and applies the resulting high power supply voltage to the power supply inputs of the first and second operational amplifiers in the noise rejection circuit, which have a greater dynamic range than the ratiometric converter. The first and second operational amplifiers are CMOS operational amplifiers that use relatively low amounts of power.

In accordance with this invention, an improved battery powered, portable ratiometric measurement instrument is provided. A noise rejection circuit coupled to a ratiometric converter increases the signal-to-noise ratio of the instrument. A scaled-up voltage is applied to a first parameter whose value is unknown such that a parameter voltage is formed at the first parameter. The noise rejection circuit divides the parameter voltage and produces a first voltage, which is applied to the ratiometric converter. The ratiometric converter is responsive to the first voltage and produces an output representative of the value of the first parameter.

In accordance with alternative aspects of the present invention, the parameter voltage is applied to a filter that filters out noise components. The filtered parameter voltage is scaled down and applied to the ratiometric converter, resulting in a further increase in the signal-to-noise ratio for the ratiometric measurement circuit.

As will be readily appreciated from the foregoing summary, the present invention provides a ratiometric measurement circuit ideally suited for portable, battery powered instruments. The ratiometric measurement circuit of the present invention includes a noise rejection circuit that uses very few components and consumes a minimal amount of additional power while improving the noise rejection of the measurement circuit.

BRIEF DESCRIPTION OF THE DRAWING

The foregoing and other advantages of this invention will become more readily appreciated as the same becomes better understood by reference to the following detailed description taken in conjunction with the accompanying drawing, wherein the Figure is a simplified schematic diagram of a ratiometric measurement circuit formed in accordance with a preferred embodiment of the present invention.

DESCRIPTION OF A PREFERRED EMBODIMENT

A ratiometric measurement circuit determines the value of an unknown parameter by establishing a ratio between the values of a known parameter and the unknown parameter. A conventional, dual slope analog-to-digital (A/D) converter may be used to make the ratiometric measurement. When used in this context, a dual slope A/D converter is commonly referred to, and hereinafter referred to, as a ratiometric converter. Ratiometric converters use relatively low amounts of power and, hence, are popular in measurement circuits where power availability is limited, such as in battery powered, portable measurement instruments.

The Figure illustrates, in simplified schematic form, a ratiometric measurement circuit formed in accordance with a preferred embodiment of the present invention. The Figure depicts a particular application of the ratiometric measurement circuit in which resistance is the measured parameter. Accordingly, the known and unknown parameters are depicted in the Figure as resistances, denoted Rref and Rx, respectively. However, it is to be understood that conductance may also be measured. Accordingly, the ratiometric measurement circuit of the present invention is not to be construed as limited to measuring resistance.

The measurement circuit includes a conventional ratiometric converter 10 coupled to a noise rejection circuit 12. The noise rejection circuit 12 is further coupled to Rref and Rx, where, as noted above, Rx is the unknown resistance to be measured. As will become better understood from the following discussion, the noise rejection circuit 12 increases the signal-to-noise ratio of the ratiometric measurement circuit by applying a scaled-up voltage to the circuit parameters and then scaling down a resulting voltage and applying the scaled-down voltage to the ratiometric converter. As a result, the noise rejection of the measurement circuit is improved. Further, the noise rejection circuit 12 uses very few components and consumes a minimal amount of power, which makes it ideally suited for portable, battery powered instruments.

The noise rejection circuit 12 depicted in the Figure comprises: two CMOS operational amplifiers, designated OA1 and OA2; four resistors, designated R1, R2, R3, and R4; and a voltage multiplier 14. A filter 16 may also be included in an alternative embodiment of the noise rejection circuit 12. The filter 16 is depicted by phantom lines in the Figure and will be discussed below.

A power supply 16 generates a voltage, $V_{CC}$. The $V_{CC}$ voltage is applied to the ratiometric converter 10. In a conventional manner, the ratiometric converter 10 regulates the value of $V_{CC}$ and produces low power supply voltages, $\pm V'_{CC}$, such that the ratiometric converter 10 operates from the $\pm V'_{CC}$ voltages. For example, if $V_{CC}$ is 9 volts, the $V'_{CC}$ voltages may be $\pm 3$ volts. In accordance with the preferred embodiment of the present invention, the voltage multiplier 14 multiplies the positive $V'_{CC}$ voltage (i.e., $\pm V'_{CC}$) and produces a high power supply voltage, $V_A$. In keeping with the above example, $V_A$ may be 12 volts. The $V_A$ voltage is applied to the positive power supply inputs of OA1 and OA2.

A reference voltage, $V_{REF}$, is applied to one input of the ratiometric converter 10 and to the noninverting input of OA1. Preferably, $V_{REF}$, has a low value, such as 1 volt, for example. A low power supply voltage and a low reference voltage may be used with the ratiometric converter 10 because of the typically low power requirements of ratiometric converters.

As depicted in the Figure and as noted above, $V_A$ is applied to the positive power supply inputs of OA1 and OA2. The negative power supply inputs of OA1 and OA2 are connected to ground. The output of OA1 is connected to one end of R1 and Rref. The other end of R1 is connected to one end of R2 and to the inverting input of OA1. The other end of R2 is connected to ground. The other end of Rref is connected to one end of Rx and to the noninverting input of OA2. The other end of Rx is connected to ground. The output of OA2 is connected to the inverting input of OA2 and to one end of R3. The other end of R3 is connected to one end of R4 and to the other input of the ratiometric converter 10. The other end of R4 is connected to ground.

As can be readily seen from the Figure, R1 and R2 determine the gain of OA1. Likewise, R3 and R4 form a voltage divider that divides the output of OA2. In accordance with the presently preferred embodiment of the invention, the ratio of R1 to R2 is substantially the same as the ratio of R3 to R4. The significance of this relationship will become apparent from the following discussion.

The noise rejection circuit 12 operates in the following manner. OA1 amplifies the reference voltage, $V_{REF}$, and produces a scaled-up voltage, $V_{S1}$. As an example, values of R1 and R2 may be selected so that OA1 has a gain of ten. In this example, the magnitude of $V_{S1}$ is ten times the magnitude of $V_{REF}$. Obviously, other values of $V_{S1}$ can be obtained with different values of R1 and R2. The $V_{S1}$ voltage is applied to the series connected resistances, Rref and Rx, where, as noted above, Rx is the unknown value to be measured. A parameter voltage, $R_X$, is formed across Rx. The magnitude of the $V_X$ voltage is related to the value of Rx.

OA2 functions as a buffer and applies a buffered $V_X$ voltage to the voltage divider formed by R3 and R4. A divided voltage, $V_{S2}$, is formed at the node between R3 and R4. As noted above, the ratio of R3 to R4 is substantially the same as the ratio of R1 to R2. Accordingly, $V_{S2}$ is scaled down by the same factor by which $V_{S1}$ is scaled up. That is, in keeping with the above example, $V_{S2}$ is scaled down by a factor of ten to form the scaled-down voltage, $V_{S2}$.

In a conventional manner, the ratiometric converter 10 integrates $V_{S2}$ in one direction and subsequently integrates the difference between $V_{REF}$ and $V_{S2}$ in the opposite direction so as to change, or de-integrate, the previously integrated value. The time it takes to change the previously integrated value to a pre-determined value, such as zero, for example, is referred to herein as the de-integration time. The de-integration time is representative of the value of Rx. An output signal, $V_{OUT}$, is formed at the output of the ratiometric converter 10, and is representative of the value of Rx. The operation of ratiometric (i.e., dual slope A/D) converters is well known in the electrical art and, hence, is not discussed in further detail herein.

Because the magnitude of $V_{S1}$ is greater than the magnitude of $V_{REF}$, the ratio of the $V_{S1}$ voltage to any noise present on the circuit comprising the Rref and Rx parameters (i.e., the signal-to-noise ratio) is greater than it would be if $V_{REF}$ was applied to Rref and Rx. Further, since R3 and R4 scale-down the parameter voltage, $V_X$, an amplified (i.e., scaled-up) parameter voltage is not applied to the ratiometric converter 10. Rather, the scaled-down parameter voltage, $V_{S2}$, is applied to the ratiometric converter 10, which in the above example, results in a 20 dB improvement in the ability of the measurement circuit to reject noise. Thus, as will become better understood from the following discussion, the noise rejection circuit 12 increases the noise rejection of the ratiometric measurement circuit without significantly increasing power consumption.

As noted above, the voltage multiplier 14 boosts the $V'_{CC}$ voltage and produces the high power supply voltage, $V_A$. Accordingly, OA1 and OA2 have a dynamic range of slightly less than On the other hand, operational amplifiers in the ratiometric converter 10 (which are not shown in the Figure) operate from the $\pm V'_{CC}$ voltage and, therefor, have a dynamic range of slightly less than $\pm V'_{CC}$. As a result, the dynamic range of the operational amplifiers in the ratiometric converter 10 is less than the dynamic range of OA1 and OA2. As is well known to a person of ordinary skill in the art, the power consumption of a component is related to the dynamic range of the component. More specifically, component power consumption increases as the the dynamic range of the component increases. Accordingly, in the preferred embodiment of the invention, the ratiometric converter 10 consumes relatively low amounts of power. Furthermore, even though OA1 and OA2 have greater dynamic range than the ratiometric converter 10 and, hence, consume greater amounts of power than the operational amplifiers in the ratiometric converter 10, the CMOS structure of OA1 and OA2 allows them to operate at relatively low power levels. Thus, the noise rejection by the ratiometric measurement circuit is increased with a minimal increase in power consumption.

In accordance with an alternative embodiment of the present invention, as noted above, a noise filter 16 may be added to the noise rejection circuit 12. More specifically, the filter 16, which may be a passive, low pass filter, is connected to the node between Rref and Rx and the noninverting input of OA2. The parameter voltage, $V_X$, is applied to the input of the filter 16, which filters the $V_X$ signal to remove, at least partially, noise components in the $V_X$ signal. A filtered $V_X$ voltage, $V'_X$, is formed at the output of the filter 16 and is applied to the noninverting input of OA2. The $V_X$ voltage is scaled down by R3 and R4 to produce the $V_{S2}$ voltage, which is applied to the ratio converter 10 in the manner discussed above.

In accordance with yet a further alternative embodiment of the present invention, the voltage multiplier 14 includes two voltage multipliers (not shown). One multiplier multiplies positive voltages (e.g., $+V'_{CC}$) and the other multiplier multiplies negative voltages (e.g., $-V'_{CC}$). In other words, in this alternative embodiment, the voltage multiplier 14 produces positive and negative power supply voltages, namely $\pm V_A$. The positive $V_A$ voltage is applied to the positive power supply inputs of OA1 and OA2 and the negative $V_A$ voltage is applied to the negative power supply inputs. Accordingly, the dynamic range of OA1 and OA2 will be slightly less than $\pm VA$.

In certain applications, the use of dual power supply voltages (i.e., $\pm V_A$) may improve the performance of the noise rejection circuit 12. For example, where Rx and, hence, Vhd X have low values and where the magnitude of AC noise components is high, the output of OA2 may be pulled negative. In such a situation, if OA2 operates from a single power supply voltage (i.e., $V_A$) instead of from dual power supply voltages (i.e., $\pm V_A$), OA2 may clip its output, thereby reducing the accuracy of the noise rejection circuit 12. It should be realized however, that while the accuracy of the noise rejection circuit 12 may be increased by using dual power supply voltages, the power consumption of the noise rejection circuit 12 is also increased. As noted above, increased power consumption is undesirable in battery powered, portable measurement instruments.

While preferred and alternative embodiments of the present invention have been illustrated and described, it will be appreciated that various changes can be made therein without departing from the spirit and scope of the invention. For example, voltage multiplier 14 may be eliminated and a high power supply voltage(s), independent of $V'_{CC}$, could be applied to OA1 and OA2. Further, if a noise filter is used, and if dual power supply voltages are present, the filter may be a suitably designed active filter. Consequently, the invention can be practiced otherwise than as specifically described herein.

The embodiments of the invention of which an exclusive property or privilege is claimed are defined as follows:

1. A ratiometric measurement circuit comprising:
   (a) a dual slope analog-to-digital converter operating from a low power supply voltage and a low reference voltage and responsive to a first voltage related to the unknown value of a first parameter so as to produce an output representative of the unknown value of the first parameter; and
   (b) a noise rejection circuit coupled to said dual slope analog-to-digital converter and the first parameter for increasing the signal-to-noise ratio of said ratiometric measurement circuit, wherein said noise rejection circuit operates from said low power supply voltage, and produces a scaled-up voltage greater than and proportional to said low reference voltage, and applies said scaled-up voltage to the first parameter so as to cause a parameter voltage to be formed at the first parameter, said noise rejection circuit dividing said parameter voltage to form said first voltage.

2. A ratiometric measurement circuit according to claim 1, wherein said noise rejection circuit amplifies said low reference voltage and divides said parameter voltage by substantially the same factor.

3. A ratiometric measurement circuit according to claim 2, wherein said noise rejection circuit comprises:
   (a) a first amplifier coupled to said dual slope analog-to-digital converter for receiving said low reference voltage and producing said scaled-up voltage;

(b) a second amplifier coupled to the first parameter for receiving said parameter voltage and producing a buffered parameter voltage; and (c) a voltage divider coupled to said second amplifier and said dual slope analog-to-digital converter for dividing said buffered parameter voltage and producing said first voltage.

4. A ratiometric measurement circuit according to claim 3, wherein the gain of said first amplifier is determined by a first pair of resistors having a first ratio and wherein said voltage divider includes a second pair of resistors having a second ratio.

5. A ratiometric measurement circuit according to claim 4, wherein said first ratio of said first pair of resistors is substantially the same as said second ratio of said second pair of resistors.

6. A ratiometric measurement circuit according to claim 5, wherein said first and second amplifiers are operational amplifiers.

7. A ratiometric measurement circuit according to claim 6, wherein said operational amplifiers are CMOS operational amplifiers.

8. A ratiometric measurement circuit according to claim 6, wherein said noise rejection circuit further comprises voltage means for increasing the magnitude of said low power supply voltage and producing a high power supply voltage, said voltage means applying said high power supply voltage to said operational amplifiers.

9. A ratiometric measurement circuit according to claim 8, wherein said voltage means includes a voltage multiplier for producing said high power supply voltage.

10. A ratiometric measurement circuit according to claim 9, wherein said operational amplifiers are CMOS operational amplifiers.

11. A ratiometric measurement circuit according to claim 8, wherein a filter is coupled to the first parameter, such that said filter filters noise components from said parameter voltage.

12. In a battery powered, portable ratiometric measurement instrument that makes ratiometric measurements of electric circuit parameters by applying a voltage to a first parameter whose value is unknown and to a second parameter whose value is known and causing a parameter voltage to be formed across the first parameter, applying the parameter voltage to a ratiometric converter operating from a low power supply voltage and a low reference voltage such that the ratiometric converter produces an output representative of the unknown value of the first parameter, the improvement comprising a noise rejection circuit coupled to the ratiometric converter and the first and second electric circuit parameters that increases the signal-to-noise ratio of the instrument by amplifying the low reference voltage and producing a scaled-up voltage whose magnitude is greater than and proportional to the magnitude of the low reference voltage, applying said scaled-up voltage to the first and second parameters so as to cause said parameter voltage to be formed at the first parameter, dividing said parameter voltage and applying a scaled-down voltage to the ratiometric converter, such that said scaled-down voltage is related to the unknown value of the first parameter.

13. An improved ratiometric measurement instrument according to claim 12, wherein said noise rejection circuit amplifies said low reference voltage and divides said parameter voltage by substantially the same factor.

14. An improved ratiometric measurement instrument according to claim 13, wherein said noise rejection circuit comprises;

(a) a first amplifier coupled to said ratiometric converter for receiving said low reference voltage and producing said scaled-up voltage;

(b) a second amplifier coupled to the first and second parameters for receiving said parameter voltage and producing a buffered parameter voltage; and (c) a voltage divider coupled to said second amplifier and said ratiometric converter for dividing said buffered parameter voltage and producing said voltage proportional to the unknown value of the first parameter.

15. An improved ratiometric measurement instrument according to claim 14, wherein the gain of said first amplifier is determined by a first pair of resistors having a first ratio and, wherein said voltage divider includes a second pair of resistors having a second ratio.

16. An improved ratiometric measurement instrument according to claim 15, wherein said first ratio of said first pair of resistors is substantially the same as said second ratio of said second pair of resistors.

17. An improved ratiometric measurement instrument according to claim 16, wherein said first and second amplifiers are operational amplifiers.

18. An improved ratiometric measurement instrument according to claim 17, wherein said operational amplifiers are CMOS operational amplifiers.

19. An improved ratiometric measurement instrument according to claim 17, wherein said noise rejection circuit further comprises voltage means for increasing the magnitude of said low power supply voltage and producing a high power supply voltage, said voltage means applying said high power supply voltage to said operational amplifiers.

20. An improved ratiometric measurement instrument according to claim 19, wherein said voltage means includes a voltage multiplier for producing said high power supply voltage.

21. An improved ratiometric measurement instrument according to claim 20, wherein said operational amplifiers are CMOS operational amplifiers.

22. An improved ratiometric measurement instrument according to claim 17, wherein a filter is coupled to said first and second parameters, such that said filter filters noise components from said parameter voltage.

* * * * *